United States Patent [19]
Keyes

[11] Patent Number: 5,841,786
[45] Date of Patent: Nov. 24, 1998

[54] TESTING OF MEMORY CONTENT

[75] Inventor: Edward Patrick Keyes, Ottawa, Canada

[73] Assignee: National Westminster Bank PLC, London, United Kingdom

[21] Appl. No.: 765,368

[22] PCT Filed: Jul. 12, 1995

[86] PCT No.: PCT/GB95/01642

§ 371 Date: Jan. 13, 1997

§ 102(e) Date: Jan. 13, 1997

[87] PCT Pub. No.: WO96/02917

PCT Pub. Date: Feb. 1, 1996

[30] Foreign Application Priority Data

Jul. 14, 1994 [GB] United Kingdom .................... 9414266

[51] Int. Cl.⁶ .............................. G11C 29/00; G11C 7/00
[52] U.S. Cl. ........................................... 371/21.1; 365/201
[58] Field of Search ................................. 371/21.1, 21.2, 371/22.1, 22.2, 24, 25.1, 67.1; 365/201, 189.07

[56] References Cited

U.S. PATENT DOCUMENTS 4,782,486 11/1988 Lipcon et al. ............................ 371/21

5,568,437 10/1996 Jamal ........................................ 365/201

FOREIGN PATENT DOCUMENTS

| 9307697 | 4/1993 | Australia | H04L 9/32 |
| 237972 | 12/1993 | New Zealand | G07F 7/12 |
| 0215464A2 | 3/1987 | WIPO | G11C 29/00 |

*Primary Examiner*—Hoa T. Nguyen
*Attorney, Agent, or Firm*—Volpf and Kofnig, P.C.

[57] ABSTRACT

A method of testing a memory associated with a microprocessor, particularly for use in smart cards. The method involves comparing the output from the memory (2) passed along a read path (10) with predetermined data signals generated externally and passed via a port (7) along a read path (9). Comparison is carried out in a comparison device (3) which may, for example, be the microprocessor, suitably programmed. The output form the comparison device (3) is a simple pass/fail verification signal applied to a port (5). The stored data held in memory (2) may be permanently held data such as in a ROM, or (where the memory is alterable) may be specially written to the memory for the purpose of the text.

20 Claims, 1 Drawing Sheet

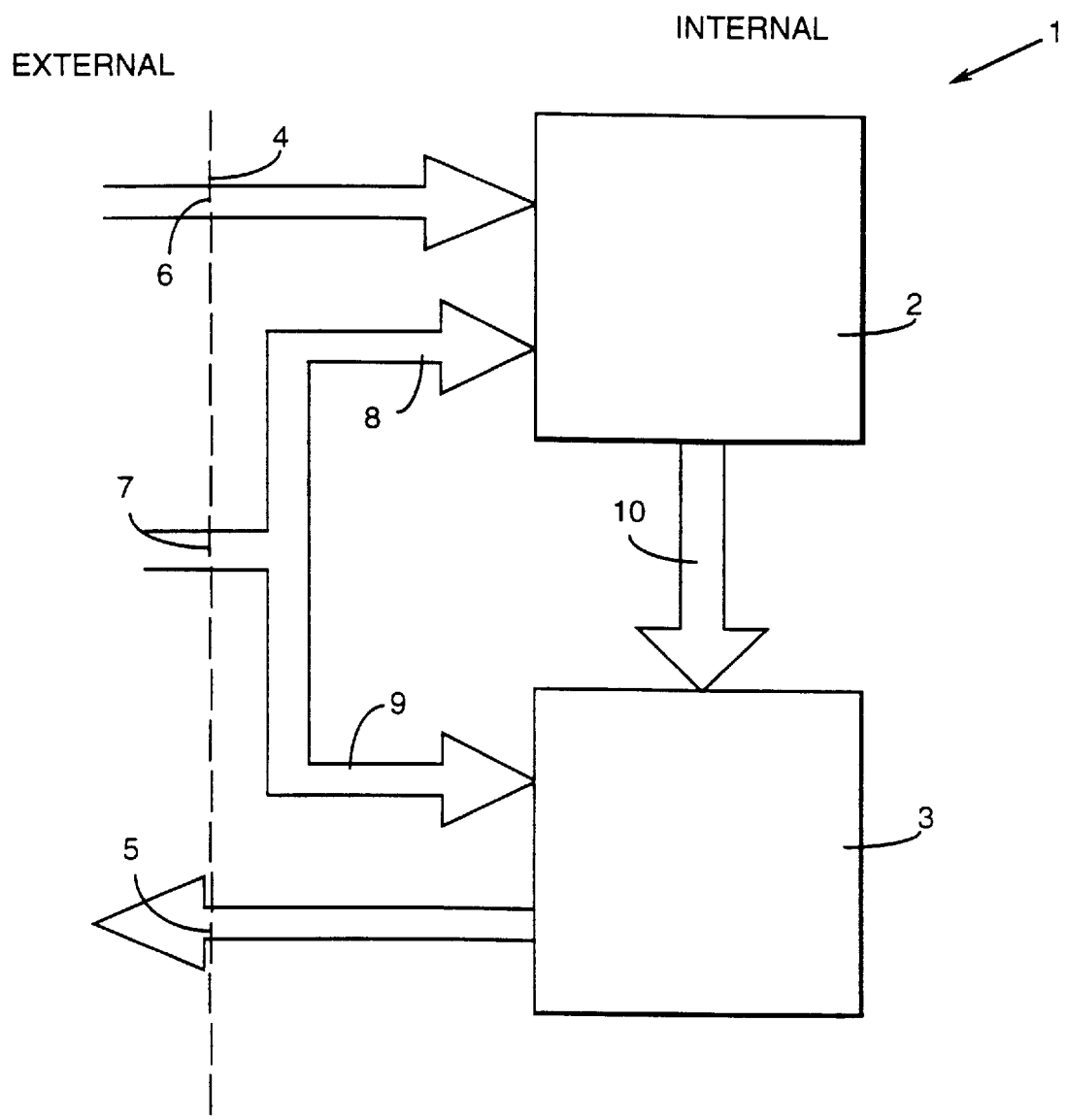

TESTING OF MEMORY CONTENT

The invention relates to the testing of the content of memory associated with a microprocessor. The memory may be memory whose contents cannot be altered (Read Only Memory or ROM) or memory whose contents can be altered such as Electrically Programmable Read Only Memory (EPROM) or RAM (Random Access Memory).

There are many instances in which memory which holds predetermined information is required to be tested. An example is in the use of integrated credit cards, otherwise know as smart cards. Conventionally, smart card memory is tested by connecting the card to a reader, reading out the memory contents and performing a check on the readout, perhaps by way of check-sum verification or by comparison of the read-out with data which should be present. Often, the memory contents are confidential and it is possible that unauthorised access to the information could be obtained by simulating a memory test. An object of the invention is to overcome this problem.

According to a first aspect of the invention there is provided a method of testing the proper functioning of an electrically alterable memory associated with an integrated circuit, the method consisting in writing test data to the memory, applying predetermined data as input to the integrated circuit, comparing the data internally within the integrated circuit with the test data held in the memory, and issuing a verification output from the integrated circuit whereby the write function and the retention properties of the memory may be verified as correct or not according to the verification output.

By this method, the write function and retention properties of an electrically alterable memory can be tested.

According to a second aspect of the invention there is provided a method of testing the content of memory associated with a microprocessor in a module, the method consisting in applying predetermined data as input to the module, encrypting the predetermined data, comparing the encrypted predetermined data internally within the module with data held in the memory and issuing a verification output from the module according to whether the memory content is verified as correct or not by the comparison.

According to the second aspect of the present invention, the data held in the memory may be data permanently or semi-permanently resident in the memory, such as program data and/or initialisation data, or it may be data written to the memory as a first step in the test method. By this latter method, the write function and retention properties of an electrically alterable memory can be tested.

The module may be an integrated circuit including the memory and the microprocessor or may be a set of integrated circuits physically bonded by encapsulation or the like. Typically the module is an integrated circuit in a smart card.

By use of an internal memory comparison technique as described above the memory contents are externally inaccessible directly. All that is output is a verification signal.

It is possible that fraudulent attempts to determine the content of the memory may be made by automatically inputting successive sets of test data which are systematically changed in content until a verification output indicates that the memory content corresponds with the input data. There are ways of dealing with this problem.

According to a feature of the invention the microprocessor is programmed to delay the issue of each verification or non-verification output. The delay between successive outputs may be a matter of microseconds or seconds. The object is to render the time taken for systematic checking to be prohibitively long.

Another way of preventing fraudulent memory checking is to arrange that the input data is encrypted, for example by being operated on by a secret algorithm, before comparison. Then the input data would have no clear correlation with the memory content. The algorithm or a key to it could be different from batch to batch of the smart cards.

The invention will further be described with reference to the accompanying drawing, of which the sole FIGURE is a schematic diagram illustrating a method embodying the invention.

Referring to the drawing there is shown an integrated circuit 1 having a memory 2 in the form of an EEPROM which contains certain data and a comparison device 3, for example in the form of a microprocessor which is programmed to effect data comparisons. An interface to the external world is represented by the dotted line 4. On the interface 4 are three ports 5, 6 and 7 whereby signals are passed to and fro between the integrated circuit 1 and the outside world. The internal route from port 7 splits into two paths: a write path 8 passing to the memory 2 and a read path 9 passing to comparison device 3.

Testing is carried out by inputting program data to the integrated circuit 1 and performing a comparison internally by means of the comparison device 3. The program data is generated by external means (not shown) and is passed to the comparison device 3 via the data input port 7 and the read path 9. Corresponding data stored in the memory 2 is passed to the comparison device 3 via a read path 10. In the comparison device, the data entering from the two paths 9 and 10 is compared and the outcome of the comparison is communicated to the outside world via port 5 by means of a verification signal identifying the comparison as Pass or Fail. This method prevents the memory contents from ever leaving the integrated circuit 1 and thus ensures high security. The read address and control signals can be generated by external means (not shown) and input to the integrated circuit through an address/control port 6 at the interface 4. The address/control signals are passed to the memory and control the passing of data from the memory 2 to the comparison device 3 in the conventional manner.

In an alternative embodiment (not shown) the ports 5 and 7 are combined into a single multiplexed read/write port and the port 6 eliminated. Address and control signals which would otherwise have used the port 6 are instead input on a multiplex basis via the sub-port 7 of the combined port 5/7 and the path 8.

The scheme also allows for the testing of the write function of electrically alterable memory by allowing test data to be written to the memory 2 via the data input port 7 at the interface 4 and the write path 8. A correct write can then be verified in the manner outlined above, again under the control of the address/control signals. In this way properties such as endurance, retention time and cell margin can all be tested.

It might still be possible for fraudulent access to the contents of memory 2 by exhaustively testing all possible combinations of memory. It can be shown that this becomes more difficult the fewer times a pass/fail signal is generated. For instance, if the pass/fail is generated after reading a single 8 bit byte, then a maximum of 256 reads are required to exhaustively test a byte. If a pass/fail signal is only generated after reading a 16 bit word however then a maximum of 65,536 reads would be required to exhaustively test a word. Similarly 4,294,967,296 reads are required to exhaustively test a 32 bit word. Exhaustive testing to extract the memory contents can easily be made unfeasible using this scheme.

An additional aid to security is to ensure that words to be tested extend over memory page boundaries, perhaps by variable amounts.

I claim:

1. A method of testing an alterable memory operatively associated with an integrated circuit comprising the steps of:

writing test data to the memory for storage;

applying predetermined input data to the integrated circuit;

comparing said predetermined input data with said test data stored in the memory with said integrated circuit; and issuing a verification output signal from the integrated circuit whereby the write function and the retention properties of the memory may be verified as correct or not according to the verification output signal.

2. The method according to claim 1 further comprising the steps of:

passing said predetermined data as a first input to a comparison device within said integrated circuit;

reading said stored memory contents by said comparison device as a second input;

comparing said predetermined data with said stored memory contents with said comparison device applied at said first and second inputs; and generating a pass or fail verification output signal.

3. The method according to claim 2 wherein said test data is passed to a write input and is temporarily stored in the memory prior to being passed to said second input of said comparison device.

4. The method according to claim 1 wherein said verification output signal is issued after a predetermined time delay.

5. The method according to claim 1 further comprising the step of encrypting said predetermined input data before said comparison step.

6. The method according to claim 1 wherein the integrated circuit includes a microprocessor which is programmed to effect said data comparison step.

7. The method according to claim 1 wherein the integrated circuit is part of a module further comprising discrete integrated circuits.

8. The method according to claim 7 wherein said integrated circuits are formed as part of a smart card.

9. A method of testing the contents of a memory, the memory associated with a microprocessor comprising a module, the method comprising the steps of:

applying predetermined input data to the module;

encrypting said predetermined data;

comparing said encrypted predetermined data internally within the module with data stored in the memory; and issuing a verification output signal from the module according to whether the memory contents is verified as correct or not by said comparison step.

10. The method according to claim 9 further comprising the steps of:

passing said predetermined input data to a first input of a comparison device comprising part of said module;

forwarding said memory data to a second input of said comparison device;

performing said comparison step between said encrypted predetermined input data and said memory data applied at said first and second inputs; and generating a verification output signal identifying the comparison as pass or fail.

11. The method according to claim 9 wherein said data stored in the memory comprises data which is resident in the memory.

12. The method according to claim 9 further comprising the step of testing a write function of the memory wherein said data stored in the memory comprises test data which is applied as input to the module and written to the memory prior to said comparison step.

13. The method according to claim 10 wherein said memory is alterable and has a write input wherein said test data is passed to said write input and is temporarily stored in said memory prior to being passed to said second input of said comparison device.

14. The method according to claim 9 wherein said verification output signal is issued after a predetermined time delay.

15. The method according to claim 9 wherein said microprocessor is programmed to effect said comparison step.

16. The method according to claim 9 wherein said module comprises one or more integrated circuits.

17. The method according to claim 16 wherein said integrated circuits are formed as part of a smart card.

18. The method according to claim 10 wherein said module comprises one or more integrated circuits.

19. The method according to claim 11 wherein said module comprises one or more integrated circuits.

20. The method according to claim 12 wherein said module comprises one or more integrated circuits.

* * * * *